US005699229A

United States Patent [19]
Brownell

[11] Patent Number: 5,699,229
[45] Date of Patent: Dec. 16, 1997

[54] COMPLIANT HINGE CLIP ATTACHMENT

[75] Inventor: Michael P. Brownell, Los Gatos, Calif.

[73] Assignee: Intel Corporation, Santa Clara, Calif.

[21] Appl. No.: 623,586

[22] Filed: Mar. 28, 1996

[51] Int. Cl.$^6$ .................................................. H05K 7/20
[52] U.S. Cl. .......................... 361/719; 248/510; 257/719; 361/704
[58] Field of Search ........................ 361/687, 688, 361/690, 702–705, 709, 710, 717–719, 720; 257/706, 707, 712, 713, 718, 719, 727; 174/16.3; 165/80.2, 80.3, 185; 24/458, 555, 575, 643; 16/355; 248/316.7, 505, 510; 267/150, 160

[56] References Cited

U.S. PATENT DOCUMENTS

| | | | |
|---|---|---|---|
| 4,679,118 | 7/1987 | Johnson | 361/704 |
| 5,099,550 | 3/1992 | Beane | 24/555 |
| 5,304,735 | 4/1994 | Earl | 361/703 |
| 5,541,811 | 7/1996 | Henningsson | 361/720 |
| 5,548,482 | 8/1996 | Hatauchi | 361/720 |

*Primary Examiner*—Gerald P. Tolin
*Attorney, Agent, or Firm*—Blakely, Sokoloff, Taylor & Zafman

[57] ABSTRACT

An electronic assembly that contains a pair of C-shaped springs that couple an integrated circuit and a lid to a printed circuit board. The assembly includes a first spring that is mounted to the printed circuit board. The first spring has a C-shaped finger. The integrated circuit is typically mounted to a substrate that is plugged into a socket which is mounted to the printed circuit board. A lid is stacked on top of the integrated circuit. The lid has a ball shaped outer rim. The assembly has a second spring which has a C-shaped finger that captures the outer rim of the lid, and a ball that is captured by the C-shaped finger of the first spring. The first and second springs are interlocked to secure the lid and integrated circuit to the printed circuit board. The lid and integrated circuit can be detached from the assembly by merely deflecting the second spring 36 and removing the components. The springs allow the lid and printed circuit board to thermally expand without creating excessive stresses in the assembly.

15 Claims, 1 Drawing Sheet

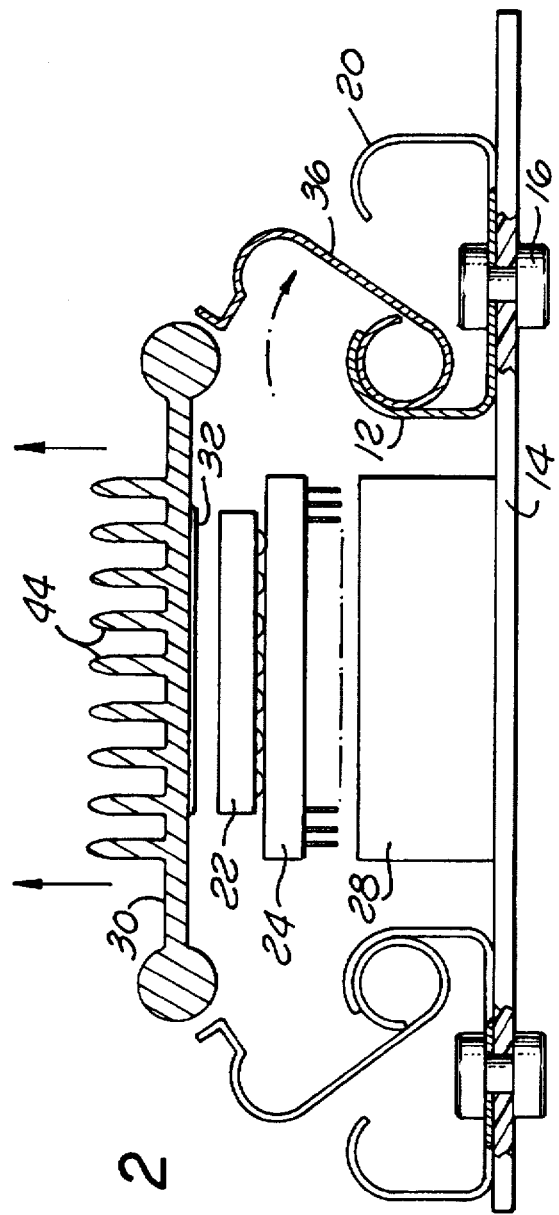

COMPLIANT HINGE CLIP ATTACHMENT

BACKGROUND OF THE INVENTION

1. Field of the Invention

The present invention relates to an electronic package assembly.

2. Description of Related Art

There has been developed electronic packages which contain an integrated circuit (IC) that is soldered to a substrate by a plurality of solder bumps located on the bottom surface of the die. Solder bump IC packages are typically referred to as "flip chip" or "C4" packages. For integrated circuits that generate a relatively large amount of heat it is desirable to couple a heat sink to the die. To minimize the thermal resistance between the heat sink and the die it is preferable to have a layer of thermal grease between the sink and the top of the integrated circuit. The heat sink may also function as a lid that encloses the die while the integrated circuit is shipped from a manufacturer to a customer. The customer can remove the lid/heat sink and use the integrated circuit for further assembly.

Shipping and handling the integrated circuit and lid may subject the circuit to external shock and vibration loads. It is therefore desirable to fasten the lid and integrated circuit to a substrate to secure the die. The lid may be bolted to the substrate, but bolts require time to both fasten and unfasten. The assembly and disassembly of bolts also requires tools that may not be available to the customer. Additionally, a bolted lid assembly may not allow the lid and printed circuit board to thermally expand without producing stresses in the solder joints of the assembly. It would be desirable to provide a means for fastening and detaching a lid and integrated circuit to a substrate without using any tools. It would also be desirable to couple a lid and an integrated circuit to a printed circuit board while allowing differential thermal expansion between the various components of the assembly.

SUMMARY OF THE INVENTION

The present invention is an electronic assembly that contains a pair of C-shaped springs that couple an integrated circuit and a lid to a printed circuit board. The assembly includes a first spring that is mounted to the printed circuit board. The first spring has a C-shaped finger. The integrated circuit is typically mounted to a substrate that is plugged into a socket which is mounted to the printed circuit board. A lid is stacked on top of the integrated circuit. The lid has a ball shaped outer rim. The assembly has a second spring which has a C-shaped finger that captures the outer rim of the lid, and a ball that is captured by the C-shaped finger of the first spring. The first and second springs are interlocked to secure the lid and integrated circuit to the printed circuit board. The lid and integrated circuit can be detached from the assembly by merely deflecting the second spring and removing the components. The springs allow the lid and printed circuit board to thermally expand without creating excessive stresses in the assembly.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a side view of an electronic assembly of the present invention;

FIG. 2 is a side view showing a lid being detached from the assembly.

DETAILED DESCRIPTION OF THE INVENTION

Referring to the drawings more particularly reference numbers, FIG. 1 shows an electronic assembly 10 of the present invention. The assembly 10 includes a first spring 12 that is mounted to a first substrate 14 by a plurality of fasteners 16. The assembly 10 may have a plurality of first springs 12, or a single spring that has an annular, rectangular, etc. shape. The first spring 12 has a C-shaped finger 18 that extends above the substrate 14. In the preferred embodiment, the first substrate 14 is a printed circuit board which has layers of power/ground planes and routing traces as is known in the art. The first spring 12 may have a second C-shaped finger 20 that is used to couple a second electronic assembly to the board, wherein the first electronic assembly 10 is electrically coupled to the second electronic assembly through the printed circuit board 14.

The assembly 10 includes an electrical device 22. The electrical device 22 is typically an integrated circuit such as a microprocessor. The electrical device 22 is preferably mounted to a second substrate 24 by a plurality of solder bumps 26. The second substrate 24 is typically constructed from a co-fired ceramic material which contains solder pads and internal routing that couple the electrical device 22 to a plurality of pins (not shown) that extend from the bottom of the substrate 24. The solder bump mounted integrated circuit and substrate are typically referred to as a flip chip package. Although a ceramic flip chip package is shown and described, it is to be understood that the assembly 10 of the present invention may capture any integrated circuit package.

In the preferred embodiment, the assembly 10 has a socket 28 that is mounted to the printed circuit board 14. The socket 28 is mated with the pins of the substrate 24 to electrically couple the electrical device 22 to the printed circuit board 14.

Stacked on top of the electrical device 22 is a lid 30. The lid 30 is typically constructed from a thermally conductive metal material and a design which facilitates the removal of heat generated by the electrical device 22. A layer of thermal grease 32 is typically applied to the top surface of the electrical device 22 to reduce the thermal impedance between the device 22 and the lid 30. The lid 30 has an outer rim 34. In the preferred embodiment, the outer rim 34 has a spherical shape. Although a ball shaped rim 34 is shown and described, it is to be understood that the outer rim may have other shapes.

The assembly 10 has a second spring 36 that couples the lid 30 to the first spring 12 and the printed circuit board 14. The assembly 10 may have a plurality of second springs 36, or a single spring 36 that extends about the lid 30. The second spring 36 has a C-shaped finger 38 that captures the outer rim 34 of the lid 30 and a spherical shaped knob 40 that is captured by the C-shaped finger 20 of the first spring 12. In the preferred embodiment, the length of the second spring 36 is such that the spring 36 exerts a biasing force to pull the lid 30 toward the printed circuit board 14.

As shown in FIG. 2, the lid 30 can be disengaged from the assembly by pulling the second spring 36 and removing the lid 30. The second spring 36 may have a tab 42 that allows an operator to more readily grab the spring 36. The assembly 10 may provide an entire operating device wherein the integrated circuit 22 communicates with external components through the printed circuit board 14. The end user may remove the electrical device 22 by deflecting the second spring 36 and unplugging the substrate 24 from the socket 28. The manufacturer of the electrical device 22 may ship the electrical device 22 within the assembly 10, wherein the customer can readily remove the device 22 by deflecting the spring 36 and detaching the lid 30 and package subassembly.

The metal lid 30 typically has a coefficient of thermal expansion which is different than the thermal expansion coefficient of the printed circuit board 14. Consequently, the lid 30 will expand or contract at a different rate than the board 14 when subjected to a change in ambient temperature. The frictional fit between the C-shaped fingers, and the spherical shaped rim and knob features, allow the lid to thermally expand relative to the board 14 without creating excessive stresses in the assembly. The present invention thus provides an electrical assembly that can be disassembled without any tools and compensates for different thermal expansion coefficients.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:

a first substrate;

a first spring that is mounted to said first substrate, said first spring has a C-shaped finger;

an electronic device that is coupled to said first substrate;

a lid that is stacked onto said electronic device, said lid having an outer rim; and, a second spring which has a C-shaped finger that captures said outer rim of said lid and a knob that is captured by said C-shaped finger of said first spring such that said lid and said electronic device are secured to said first substrate.

2. The assembly as recited in claim 1, wherein said outer rim has a spherical shape.

3. The assembly as recited in claim 2, wherein said knob has a spherical shape.

4. The assembly as recited in claim 1, wherein said first substrate is a printed circuit board.

5. The assembly as recited in claim 1, further comprising a second substrate that is attached to said electronic device.

6. The assembly as recited in claim 5, further comprising a socket that is mounted to said first substrate and coupled to said second substrate.

7. The assembly as recited in claim 1, further comprising a thermal grease that is located between said lid and said electronic device.

8. The assembly as recited in claim 1, wherein said second spring has a tab.

9. The assembly as recited in claim 1, wherein said electronic device is a microprocessor.

10. An electronic assembly, comprising:

a printed circuit board;

a first spring that is mounted to said printed circuit board, said first spring has a C-shaped finger;

a socket mounted to said printed circuit board;

a substrate coupled to said socket;

an electronic device that is mounted to said substrate;

a lid that is stacked onto said electronic device, said lid has an outer spherical rim; and, a second spring which has a C-shaped finger that captures said outer spherical rim of said lid and a ball that is captured by said C-shaped finger of said first spring such that said lid and said electronic device are secured to said printed circuit board.

11. The assembly as recited in claim 10, further comprising a thermal grease that is located between said lid and said electronic device.

12. The assembly as recited in claim 11, wherein said second spring has a tab.

13. The assembly as recited in claim 12, wherein said electronic device is a microprocessor.

14. A method for assembling an electronic assembly, comprising the steps of:

a) providing a printed circuit board which has a first spring, said first spring having a C-shaped finger;

b) mounting an electronic device to said printed circuit board;

c) mounting a lid onto said electronic device, said lid having an outer rim;

d) attaching a second spring to said lid and said first spring by placing said outer rim of said lid within a C-shaped finger of said second spring, and a knob of said second spring within said C-shaped finger of said first spring.

15. The method as recited in claim 14, further comprising the steps of pulling said C-shaped finger of said second spring and disengaging said lid from said second spring.

* * * * *